United States Patent
Grodzki et al.

(10) Patent No.: US 9,846,213 B2
(45) Date of Patent: Dec. 19, 2017

(54) OPTIMIZATION OF THE NOISE DEVELOPMENT OF A 3D GRADIENT ECHO SEQUENCE IN A MAGNETIC RESONANCE SYSTEM

(71) Applicant: Siemens Aktiengesellschaft, Munich (DE)

(72) Inventors: David Grodzki, Erlangen (DE); Vladimir Jellus, Kirchehrenbach (DE)

(73) Assignee: Siemens Aktiengesellschaft, Munich (DE)

( * ) Notice: Subject to any disclaimer, the term of this patent is extended or adjusted under 35 U.S.C. 154(b) by 602 days.

(21) Appl. No.: 14/501,464

(22) Filed: Sep. 30, 2014

(65) Prior Publication Data

US 2015/0091567 A1 Apr. 2, 2015

(30) Foreign Application Priority Data

Sep. 30, 2013 (DE) .......... 10 2013 219 754

(51) Int. Cl.
| | |
|---|---|
| *G01R 33/56* | (2006.01) |
| *G01R 33/48* | (2006.01) |
| *G01R 33/561* | (2006.01) |
| *G01R 33/385* | (2006.01) |
| *G01R 33/54* | (2006.01) |

(52) U.S. Cl.
CPC ..... *G01R 33/5608* (2013.01); *G01R 33/3854* (2013.01); *G01R 33/4818* (2013.01); *G01R 33/4822* (2013.01); *G01R 33/5616* (2013.01); *G01R 33/543* (2013.01)

(58) Field of Classification Search
CPC .............. G01R 33/543; G01R 33/5659; G01R 33/3415; G01R 33/36; A61B 5/055
USPC ........................................................ 324/309
See application file for complete search history.

(56) References Cited

U.S. PATENT DOCUMENTS

| | | | |
|---|---|---|---|
| 5,329,231 A | 7/1994 | Hatta et al. | |
| 6,078,176 A | 6/2000 | McKinnon | |
| 6,728,569 B2 * | 4/2004 | Edelman .......... | G01R 33/56375 |
| | | | 324/306 |

(Continued)

FOREIGN PATENT DOCUMENTS

| | | |
|---|---|---|
| CN | 101034148 A | 9/2007 |
| CN | 101143094 A | 3/2008 |

(Continued)

OTHER PUBLICATIONS

"Quiet T1-Weighted Head Scanning Using PETRA," Grodzki et al., Proc. Intl. Soc. Mag. Reson. Med. 21 (2013), p. 0456.

(Continued)

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

In a method according to optimize the noise development of a 3D gradient echo sequence in a magnetic resonance system, an optimization of at least one parameter of the gradient echo sequence, from the group including: the excitation pulse (the duration of the excitation pulse); the order of k-space lines to be scanned in k-space; and the readout direction of the k-space lines to be scanned in k-space, is implemented such that the gradients to be switched have optimally minimal slew rates, amplitudes and/or polarity changes.

12 Claims, 4 Drawing Sheets

(56) References Cited

U.S. PATENT DOCUMENTS

| | | | |
|---|---|---|---|
| 7,941,204 B1* | 5/2011 | Wang | G01R 33/4824 |
| | | | 324/307 |
| 2001/0017544 A1 | 8/2001 | Miyamoto | |
| 2001/0026155 A1* | 10/2001 | Lehr | G01R 33/561 |
| | | | 324/307 |
| 2004/0257078 A1 | 12/2004 | Porter | |
| 2005/0017719 A1 | 1/2005 | Heubes | |
| 2005/0083056 A1 | 4/2005 | Harvey et al. | |
| 2005/0275402 A1* | 12/2005 | Campagna | G01R 33/3415 |
| | | | 324/309 |
| 2008/0024129 A1 | 1/2008 | Heid | |
| 2009/0069668 A1* | 3/2009 | Stemmer | A61B 5/055 |
| | | | 600/413 |
| 2010/0308829 A1* | 12/2010 | Vu | G01R 33/288 |
| | | | 324/314 |
| 2011/0152668 A1* | 6/2011 | Stemmer | G01R 33/5676 |
| | | | 600/413 |
| 2012/0280684 A1 | 11/2012 | Kim et al. | |
| 2013/0084023 A1* | 4/2013 | Corum | G06T 5/006 |
| | | | 382/264 |
| 2013/0200893 A1* | 8/2013 | Heismann | G01R 33/3854 |
| | | | 324/314 |
| 2014/0021950 A1 | 1/2014 | Grodzki | |
| 2014/0232396 A1 | 8/2014 | Grodzki et al. | |

FOREIGN PATENT DOCUMENTS

| | | |
|---|---|---|
| JP | 2000051176 A | 2/2000 |
| WO | WO-95/34242 A1 | 12/1995 |

OTHER PUBLICATIONS

"Single Point Imaging with Suppressed Sound Pressure Levels Through Gradient-Shape Adjustment," Latta et al., Journal of Magnetic Resonance, vol. 170 (2004), pp. 177-183.

"Fast Spin Echo and Fast Gradient Echo MRI With Low Acoustic Noise," Hennel, Journal of Magnetic Resonance Imaging, vol. 13 (2001), pp. 960-966.

* cited by examiner

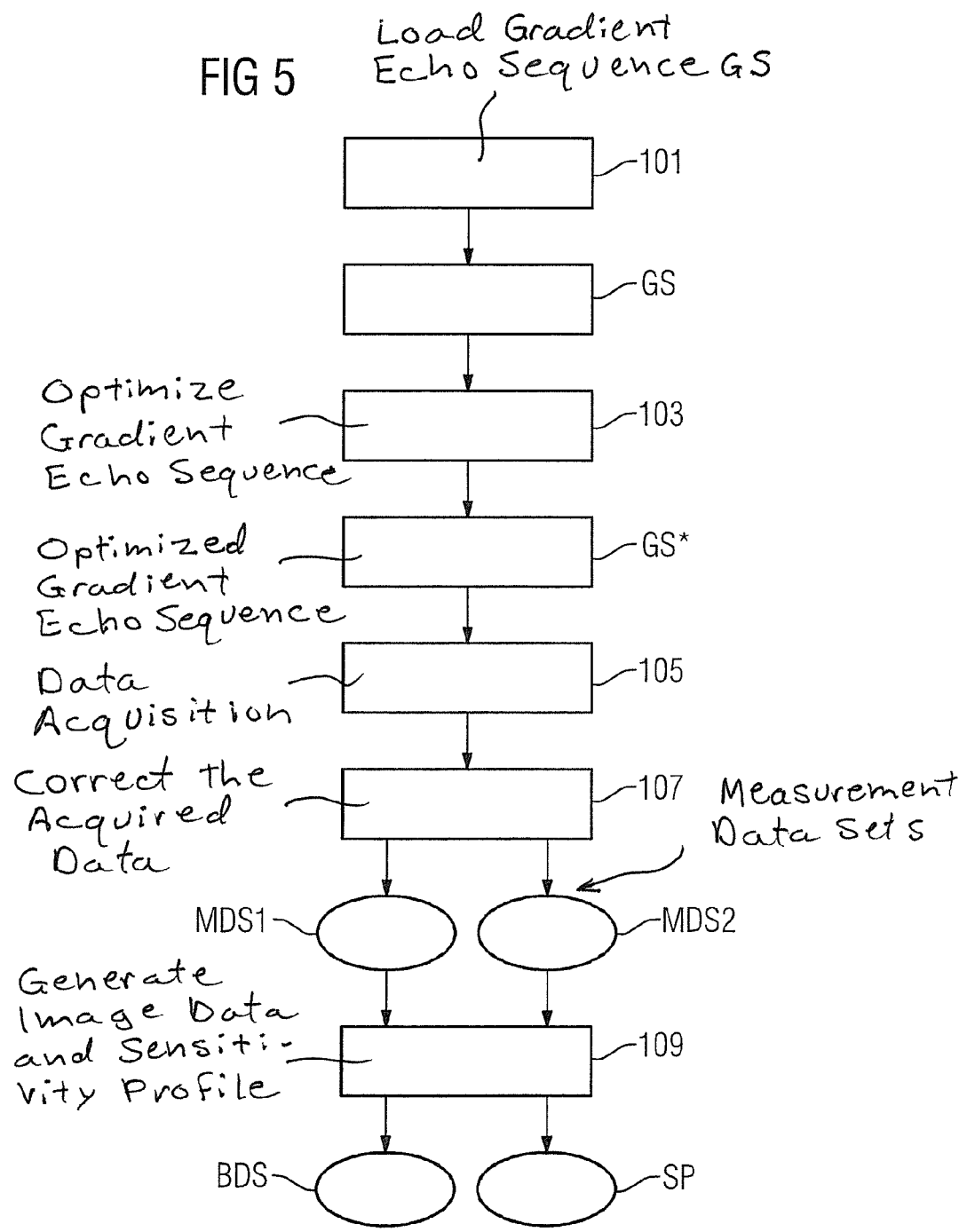

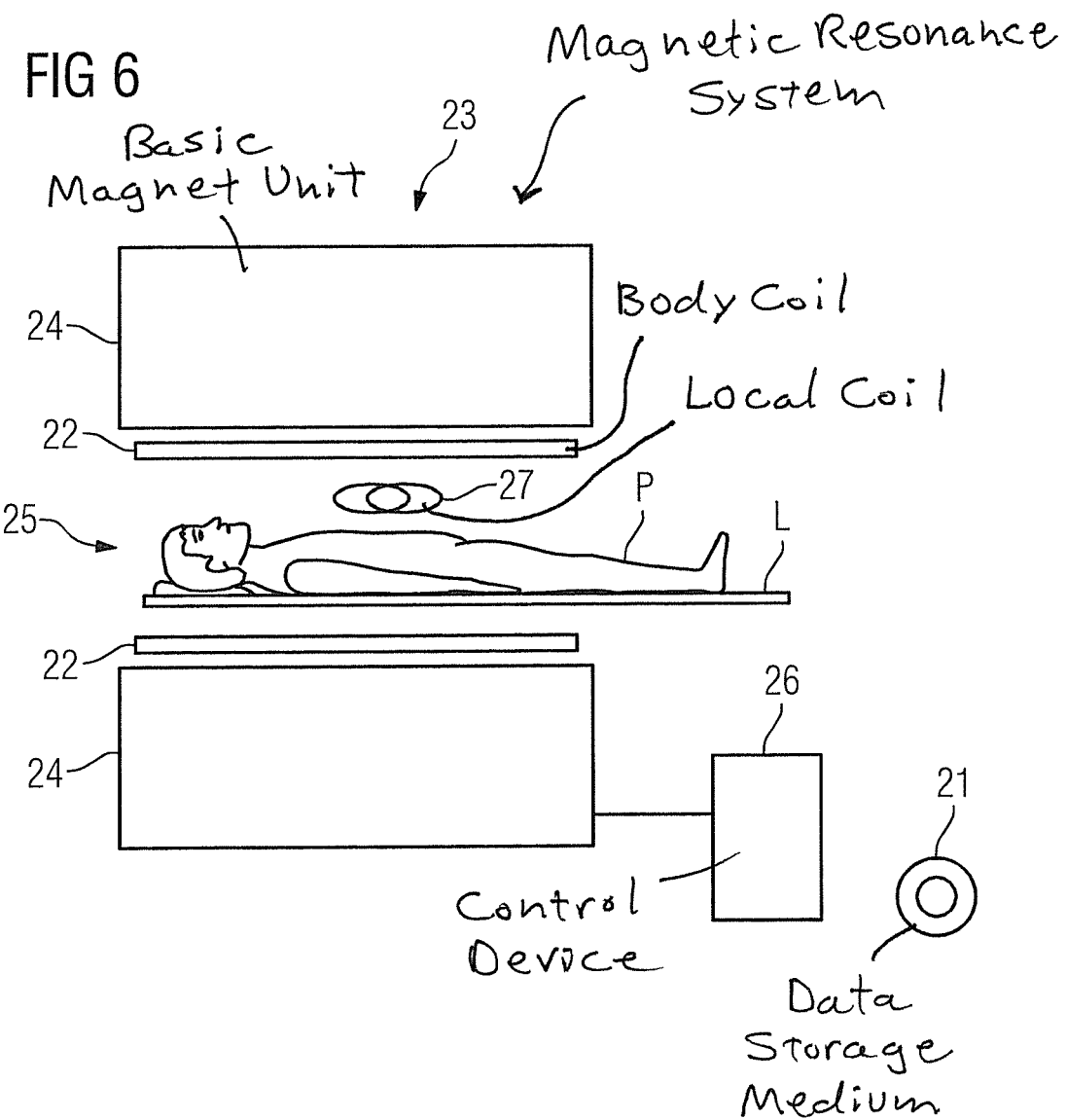

OPTIMIZATION OF THE NOISE DEVELOPMENT OF A 3D GRADIENT ECHO SEQUENCE IN A MAGNETIC RESONANCE SYSTEM

BACKGROUND OF THE INVENTION

Field of the Invention

The invention concerns an optimization of the noise development of a 3D gradient echo sequence in a magnetic resonance system.

Description of the Prior Art

Magnetic resonance (MR) is a known modality with which images of the inside of an examination subject can be generated. Expressed in a simplified manner, the examination subject is positioned inside a magnetic resonance apparatus in a relatively strong, static, homogeneous basic magnetic field (also called a $B_0$ field) with field strengths from 0.2 Tesla to 7 Tesla or more, such that the nuclear spins of the examination subject orient along the basic magnetic field. To trigger nuclear magnetic resonances, radio-frequency excitation pulses (RF pulses) are radiated into the examination subject, the triggered nuclear magnetic resonance signals are measured (detected) as data known as k-space data, and on the basis of the k-space data MR images are reconstructed or spectroscopy data are determined. For spatial coding of the measurement data, rapidly switched magnetic gradient fields are superimposed on the basic magnetic field. The acquired measurement data are digitized and stored as complex numerical values in a k-space matrix. An associated MR image can be reconstructed from the k-space matrix populated with values, by a multidimensional Fourier transformation.

A preferred pulse sequence for excitation and acquisition of the magnetic resonance signals is known as a gradient echo sequence, in particular to acquire three-dimensional (3D) data sets. However, such gradient echo-based MR examinations are generally very loud, and therefore uncomfortable for the patient being examined. The main reason for the high noise development is the gradient configurations rapidly changing over time, and the high slew rates (chronological change of the gradient amplitudes dG/dt) associated therewith. Moreover, parameters that require particularly fast switching of the gradients (for example echo times or gradient spoiling) are often required in the protocol of the sequence.

In spite of this, non-selective 3D gradient echo measurements are often used in clinical imaging, but primarily for what are known as preparation measurements. The most important example of such a preparation measurement is a coil sensitivity measurement, which is implemented at least once before beginning the actual patient examination (diagnostic data acquisition) of each patient, if an acquisition coil is used that has a sensitivity profile that is different depending on use. During the coil sensitivity measurement, two 3D measurement data sets are acquired, one measurement data set being acquired with a coil or antenna known as a "body coil", which is integrated into the magnetic resonance system, and the other measurement data set is acquired with a local coil to be used. The sensitivity profile of the local coil (and therefore the intensity distribution of the local coil image) can be calculated on the basis of these two measurement data sets (which in particular include a division of the two images reconstructed from the respective measurement data sets), and inhomogeneities that arise due to the relative distances of the measurement subject to be examined from the coil element or elements of the local coil can be corrected.

In order to decrease the noise volume of such measurements, the maximum gradient performance provided by the sequence can be decreased until the measurement is markedly quieter. However, the minimum echo time thereby increases, the maximum bandwidth may possibly decrease, and the repetition time TR of the sequence and the measurement time increase, such that the result of the measurement is not optimal under the circumstances.

SUMMARY OF THE INVENTION

An object of the invention is to enable an optimization of the noise development of an (in particular non-selective) 3D gradient echo sequence in a magnetic resonance system in a simple manner.

The method according to the invention for optimization of the noise development of a 3D gradient echo sequence in a magnetic resonance system includes an optimization of at least one parameter of the gradient echo sequence from the group including the excitation pulse (the duration of the excitation pulse), the order of the k-space lines to be scanned (filled with data) in k-space, and the readout direction of the k-space lines to be scanned in k-space, such that the gradients to be switched have optimally minimal slew rates, amplitudes and/or polarity changes.

Via the optimization of the gradient echo sequence according to the invention, the requirements that are imposed upon execution of the gradient echo sequence at the gradient system of the magnetic resonance system can be markedly reduced. For example, with the method according to the invention it is possible to reduce the maximum required slew rate by a factor of five to ten. Therefore, with the method according to the invention, older or simpler ("low-end") magnetic resonance systems can also implement gradient echo sequences optimized according to the invention, such that modern MR measurements can also be implemented at such magnetic resonance systems. Furthermore, the gradient coil is heated less upon implementation of such an optimized gradient echo sequence, and also vibrates less than in the case of conventional gradient echo sequences. Overall, a noise reduction of up to 15 to 20 dB (A) can be achieved with the method. In particular for the measurements described above of sensitivity profiles of local coils that must be implemented at least once per patient, this represents an enormous increase of the comfort for the patient. With the method according to the invention, the noise development in the implementation of gradient echo sequences can be markedly reduced without needing to change settings such as echo time, bandwidth, repetition time or measurement time.

A magnetic resonance system according to the invention has a control device designed to implement the method according to the invention.

An electronically readable data medium according to the invention is encoded with electronically readable control information (programming instructions) that cause a computer of a magnetic resonance apparatus, into which the storage medium is loaded, to operate the magnetic resonance apparatus so as to execute the method according to the invention.

The advantages and embodiments described in relation to the method analogously apply to the magnetic resonance system and the electronically readable data storage medium.

BRIEF DESCRIPTION OF THE DRAWINGS

FIG. 5 is a flowchart of an embodiment of the method according to the invention.

FIG. 6 schematically illustrates a magnetic resonance system according to the invention.

DESCRIPTION OF THE PREFERRED EMBODIMENTS

Figure 1:
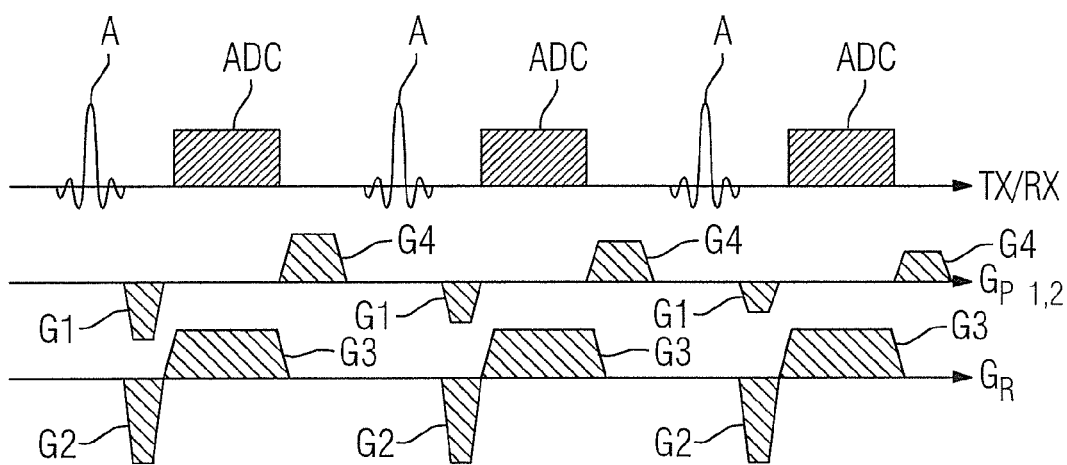
FIG. 1 is a schematic sequence diagram of a conventional 3D gradient echo sequence.

FIG. 1 schematically shows a portion of a conventional 3D gradient echo sequence. The radio-frequency pulses—in particular the excitation pulses A and the readout processes (ADC)—are shown in the uppermost line (TX/RX). The time interval between two excitation pulses A corresponds to the repetition time TR in which a repetition of the gradient echo sequence is implemented. In a simplified summary, the gradients in the two phase coding directions P1 and P2 (in particular the phase coding gradient G1 and the spoiler gradients or, respectively, rephasing gradients G4) are shown in the second line ($G_{P1,2}$). In the following, this is shortened to writing only spoiler gradients G4. Finally, the gradients in the readout direction—in particular the pre-dephasing gradients G2 and the readout gradients G3—are shown in the lowermost line ($G_R$).

In particular if short echo times (time between excitation pulse A and following readout process ADC) are desired, very high slew rates are used in the read direction GR for the pre-dephasing gradients G2 and in the phase coding direction P1,2 for the phase coding gradients G1, which poses high requirements for the gradient system of the magnetic resonance installation and leads to an increased noise development.

Figure 2:
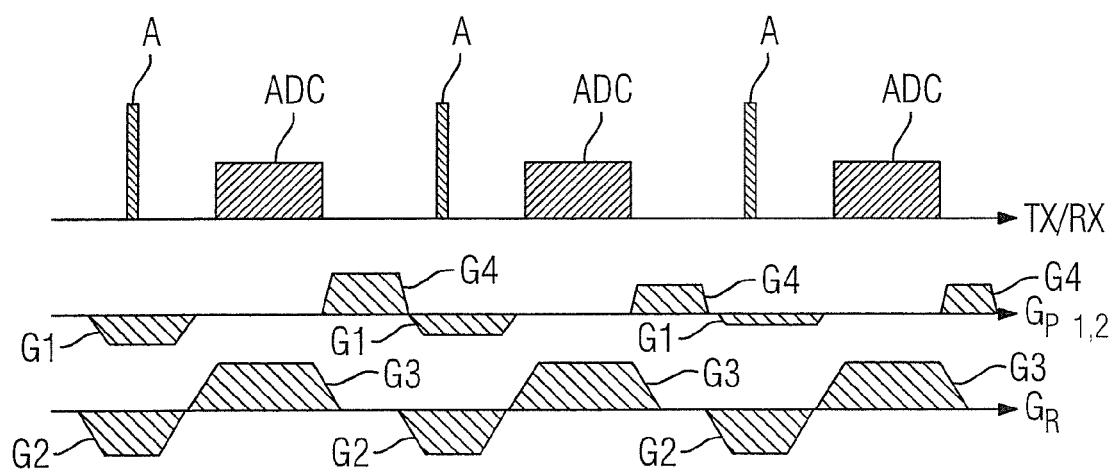
FIG. 2 is a schematic sequence diagram of an example of a 3D gradient echo sequence optimized according to the invention.

FIG. 2 now shows a first form of a gradient echo sequence optimized according to the invention. In the shown example, in comparison to the conventional gradient echo sequence from FIG. 1 the excitation pulse A is chosen to be as short as possible, and the duration of the excitation pulse A is thus optimized. The labels from FIG. 1 have been retained for better comparability.

In FIG. 2, the excitation pulse A is a square wave pulse since the emission of such a pulse takes particularly little time. The shortening of the excitation pulse A can hereby be determined depending on the desired flip angle and on the maximum B1 field possible in the magnetic resonance system.

Since short repetition times TR and small flip angles are most often used given non-selective 3D gradient echo sequences, the excitation pulse A can be markedly shortened. For example, given a flip angle of up to 5° or even up to 8° the excitation pulse can generally be shortened from a duration of (for example) approximately 1 millisecond to approximately 15 microseconds.

Given consistent echo time, more time hereby remains between excitation pulse A and readout process ADC in order to place and ramp up the switching gradients G1, G2, G3 and G4, which in particular allows lower slew rates and/or gradient amplitudes.

Such a shortened excitation pulse A has a high excitation bandwidth. A pre-dephasing gradient G2 and/or phase coding gradient G1 that is to be switched before the excitation process ADC can thereby already be switched before the excitation pulse A, such that it has already reached his full strength before the radiation of the excitation pulse A, as is likewise shown in FIG. 2. In this way, the coding of the spins already begins as of the middle of the excitation pulse A, and slew rate, gradient amplitude (and therefore volume) can be reduced again.

Figure 3:
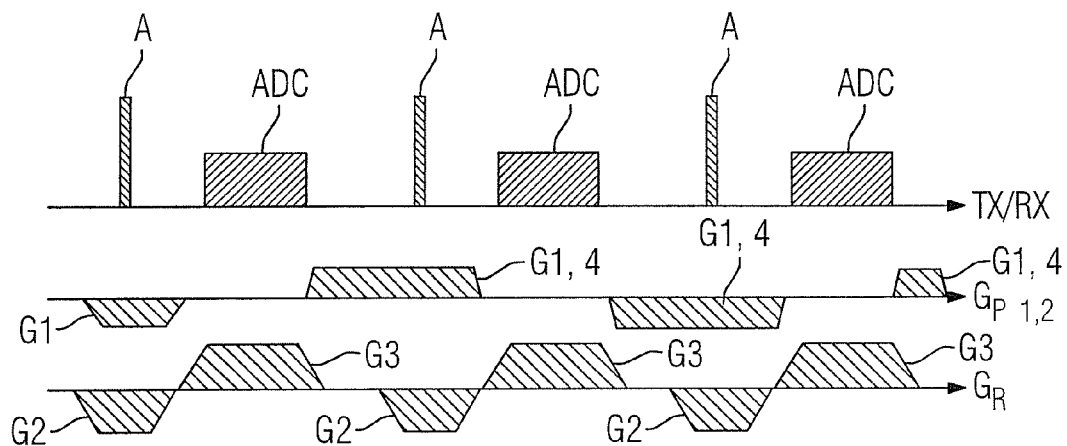
FIG. 3 is a schematic sequence diagram of an additional example of a 3D gradient echo sequence optimized according to the invention.

FIG. 3 shows an additional schematic sequence diagram of a gradient echo sequence optimized according to the invention. In the example shown here, in comparison to the sequence diagram from FIG. 2 the order of the k-space lines to be scanned in k-space is furthermore selected such that the amplitude and the polarity of a spoiler gradient G4 to be switched before an excitation pulse A and of a phase coding gradient G1 to be switched during the excitation pulse where possible is identical, or at least does not deviate by more than a predetermined threshold. For example, the threshold can be set to up to 20%, such that the amplitude of a spoiler gradient G4 to be switched before the excitation pulse A and the amplitude of a phase coding gradient to be switched during the excitation pulse A respectively do not deviate by more than 20%. For a better result, the threshold can also be set to up to 10%. A change of the polarity can also hereby be allowed insofar as the amplitude changes further only within the threshold. Instead of separate spoiler gradients G4 and phase coding gradients G1, what are known as combined "spoiler phase coding gradients" G1,4 therefore respectively result since no change (or only as small a change as possible) of the gradient switching must take place between the spoiler gradients G4 and the subsequent phase coding gradient G1.

For example, instead of scanning the k-space lines in succession in the order −N, −N+1, . . . , N−1, N, an order of the scanning of the k-space lines can hereby be chosen according to −N, N−1, −N+2, N−3, . . . , −N+1, N. The gradient activity in the phase coding directions P1 and P2 can be halved via such a selection of the order of the k-space lines to be scanned in k-space. Furthermore, the slew rates can be even further reduced in this manner.

Figure 4:
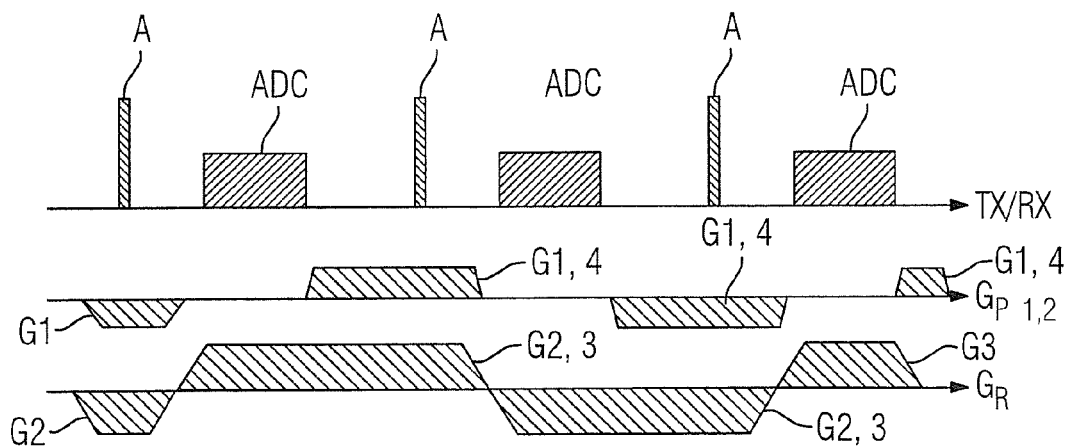
FIG. 4 is a schematic sequence diagram of yet another example of a 3D gradient echo sequence optimized according to the invention.

FIG. 4 shows an additional schematic sequence diagram of yet another example of a 3D gradient echo sequence optimized according to the invention. In the example shown here, the k-space lines to be scanned in k-space have furthermore been scanned—in comparison to the sequence diagram from FIG. 3—such that the readout direction revolves per repetition of the gradient echo sequence. As is apparent, this can be achieved in that the polarity of the readout gradients G3 to be switched changes for each repetition. When possible, the polarity and amplitude of a readout gradient G3 to be switched can hereby advantageously be chosen to be identical to the polarity and amplitude of a subsequent pre-dephasing gradient G2. Instead of separate readout gradients G3 and pre-dephasing gradients G2, what are known as combined "readout pre-dephasing gradients" G2,3 therefore respectively result since no change of the gradient switching must take place between the readout gradient G3 and the following pre-dephasing gradient G2. Analogous to the "spoiler phase coding gradients G1,4 that have been described in relation to FIG. 3, here as well at least one limitation of the deviation of the amplitudes to a maximum of a predetermined threshold can take place instead of an identity [sic] of the amplitudes and polarities.

By this measure, the gradient activity can be reduced again. Such an acquired measurement data set from which an image should be reconstructed includes mixed, acquired k-space lines with opposite readout direction. Such a change to the readout direction can lead to artifacts in the environment of magnetic field inhomogeneities. However, this can be compensated again similar to as is known given the known EPI sequence.

With a gradient echo sequence optimized in this manner with regard to the readout directions, in particular a first measurement data set and a second measurement data set can be acquired in an interleaved manner such that the k-space lines of the first measurement data set that are to be scanned in k-space are always read out in the one direction, and the k-space lines of the second measurement data set that are to be scanned in k-space are always read out in the other direction. In this way, the described problem of the possible formation of artifacts is elegantly circumvented since every measurement data set is respectively acquired in one direction.

Such a procedure is especially recommended for measurements of sensitivity profiles in which a first measurement data set is acquired by means of a first acquisition coil (at least one body coil integrated into the magnetic resonance system) and a second measurement data set is acquired by means of a local coil, for which the sensitivity profile should be determined using the first and second measurement data set. As a further advantage for the measurement of the sensitivity profile, a reduced movement sensitivity of the acquisition of the first and second measurement data set hereby results since this takes place in an interleaved manner. Since the bandwidth is very high in measurements of the coil sensitivity profiles, no negative influences due to the optimization are to be expected given the determination of the sensitivity profile from the two first and second measurement data sets acquired with such a gradient echo sequence optimized according to the example of FIG. 4.

The individual optimization measures here have been presented step-by-step using FIGS. 1 through 4. The measures shown in FIGS. 2 through 4 are, however, independent of one another in principle, and therefore can be arbitrarily combined or also individually applied in order to optimize a gradient echo sequence according to the invention.

In the realization of the described measures, care can furthermore be taken that the moments between the excitation pulses A and the following readout process ADC respectively remain unchanged relative to corresponding repetitions of the original, unoptimized gradient echo sequence. It is thus ensured that exactly the same measurement data are acquired with the optimized gradient echo sequence as with the unoptimized. The retention of the moments is ensured via suitable boundary conditions in the computer-assisted optimization that is conducted.

The described method was tested in simulations. The required slew rates could thereby be decreased from their original values through 120 mT/m/ms to approximately 10-20 mT/m/ms. Experimentally, a noise reduction of approximately 10-20 dB(A) results from such a reduction of the slew rates. In addition to this, the gradients change their polarity only half as often, whereby the generated acoustic frequency is halved, which is generally perceived by patients as very comfortable.

FIG. 5 is a schematic workflow diagram of a method according to the invention.

A conventional gradient echo sequence GS which should be applied in a pending measurement, for example, is initially used—in particular is loaded into a control unit (Block 101).

In the control unit, the gradient echo sequence GS is optimized as described above (Block 103) and a gradient echo sequence GS* optimized with regard to the noise development caused by said gradient echo sequence GS* is obtained, and markedly quieter measurements can thus be implemented.

At least one measurement (data acquisition) of a subject to be examined can take place with the optimized gradient echo sequence (Block 105). The measurement data acquired in this manner are possibly to be corrected as described above (Block 107), for example given a change of the readout direction per repetition and therefore formation of artifacts in the environment of magnetic field inhomogeneities (analogous to as in the known EPI sequence). A measurement data set MDS1, or (for example) even two measurement data sets MDS1 and MDS2, can be acquired with the measurement 105, wherein the workflow proceeds as described in relation to FIG. 4. The acquired measurement data sets can furthermore be processed in the control device of the magnetic resonance system, for example, wherein image data BDS can be obtained from the measurement data set and/or the measurement data sets, for example, in Step 109. If two measurement data sets MDS1 and MDS2 are acquired with different acquisition coils of the magnetic resonance system—for example with a body coil and with a local coil—a sensitivity profile SP of the local coil can furthermore be determined in a typical manner, also in Step 109.

Finally, FIG. 6 shows a schematic drawing of a magnetic resonance system 23 according to the invention. As is known, this comprises: a basic magnet unit 24 that defines a patient receptacle 25 that can be provided surrounding a radio-frequency coil arrangement (in particular a body coil 22); and a gradient coil arrangement. A patient P or another examination subject to be examined—in particular on a patient bed L—can be introduced into the patient receptacle 25 in the magnetic resonance system 23. Furthermore, the magnetic resonance system 23 can have at least one additional, transportable radio-frequency coil arrangement (a local coil 27) that can be variably introduced into the patient receptacle. For example, the local coil 27 can have at least two individual coils with a respective acquisition channel. The operation of the magnetic resonance system 23 is controlled by a control device 26 that is designed to implement the method according to the invention, in particular thus to optimize gradient echo sequences as has been described. For this, the control device is configured to execute computer-assisted optimization, for example prevalent optimization algorithms that are programmable corresponding to the described method.

For example, the method according to the invention is implemented by a computer program according to the invention at a control device 26 of the magnetic resonance system 23 that is executed at said control device 26. The control device 26 is therefore designed to be able to implement a method according to the invention. For example, for this purpose, an electronically readable data storage medium 21 is encoded with electronically readable control information designed to implement the method according to the invention to determine sensitivity profiles of local coils as described, upon loading of the data medium 21 in the control device 26 of the magnetic resonance system 23.

Although modifications and changes may be suggested by those skilled in the art, it is the intention of the inventors to embody within the patent warranted hereon all changes and modifications as reasonably and properly come within the scope of their contribution to the art.

We claim as our invention:

1. A computerized method to optimize noise development that occurs in a magnetic resonance apparatus operated with a 3D gradient echo sequence comprising:
   providing a computerized processor with a 3D gradient echo sequence that comprises an excitation pulse and a plurality of activated magnetic field gradients, including a readout gradient that, when activated, causes magnetic resonance data to be read out and entered into a memory organized as k-space along k-space lines, said gradient being activated with respective slew rates, amplitudes and polarity changes;
   in said computerized processor, automatically optimizing at least one parameter of said 3D gradient echo sequence selected from the group consisting of said excitation pulse, an order of entry of data into said k-space lines of k-space, and said readout direction, to cause said gradient to be activated with at least one of optimally minimal slew rates, optimally minimal amplitudes, and optimally minimal polarity changes to produce an optimized gradient echo sequence; and
   making said optimized gradient echo sequence available at an output of said processor in electronic form with a format for operating said magnetic resonance apparatus.

2. A method as claimed in claim 1 comprising selecting said excitation pulse to be as short as possible dependent on a flip angle to be achieved with said excitation pulse, and a maximum B1 field that is physically possible in said magnetic resonance apparatus.

3. A method as claimed in claim 2 comprising generating said excitation pulse as a square wave pulse.

4. A method as claimed in claim 2 comprising activating at least one of a pre-dephasing gradient and a phase encoding gradient to be activated before said readout gradient in a way that the activated pre-dephasing gradient or phase encoding gradient reach their full strength before radiation of said excitation pulse.

5. A method as claimed in claim 1 comprising selecting said order of data entry into k-space lines to cause the amplitude and the polarity of a spoiler gradient to be activated before an excitation pulse, and the amplitude and polarity of a phase encoding gradient activated during said excitation pulse, to be identical, or to cause said amplitudes to deviate from each other by no more than a predetermined threshold.

6. A method as claimed in claim 1 comprising entering said data into said k-space lines with said readout direction reversing direction respectively in each repetition of said gradient echo sequence.

7. A method as claimed in claim 6 comprising activating said readout gradient with an amplitude and polarity that is identical to an amplitude and polarity of a pre-dephasing gradient that is activated at said excitation pulse of a following repetition of said gradient echo sequence, or with the respective amplitudes deviating from each other by no more than a pre-determined threshold.

8. A method as claimed in claim 6 comprising acquiring a first measurement data set and a second measurement data set in an interleaved manner with multiple gradient echo sequences, with k-space lines of said first measurement data set being always read out in one direction, and k-space lines in said second measurement data set being read out in the reverse direction.

9. A method as claimed in claim 8 comprising acquiring said first measurement data set with a local coil, and acquiring said second measurement data set with a body coil, and determining a sensitivity for profile of said local coil in said processor from said first and second measurement data sets.

10. A method as claimed in claim 1 comprising maintaining respective gradient moments unchanged in said optimized gradient echo sequence between an excitation pulse and a following readout gradient relative to corresponding repetitions of the original, unoptimized gradient echo sequence.

11. A magnetic resonance apparatus comprising:
    a magnetic resonance data acquisition unit;
    a memory organized as k-space;
    a computerized processor provided with a 3D gradient echo sequence that comprises an excitation pulse and a plurality of activated magnetic field gradients, including a readout gradient that, when activated, causes magnetic resonance data to be read out and entered into said memory organized as k-space along k-space lines, said gradient being activated with respective slew rates, amplitudes and polarity changes;
    said computerized processor being configured to automatically optimize at least one parameter of said 3D gradient echo sequence selected from the group consisting of said excitation pulse, an order of entry of data into said k-space lines of k-space, and said readout direction, to cause said gradient to be activated with at least one of optimally minimal slew rates, optimally minimal amplitudes, and optimally minimal polarity changes to produce an optimized gradient echo sequence; and
    said computerized processor being configured to operate said data acquisition unit with said optimized gradient echo sequence.

12. A non-transitory, computer-readable data storage medium encoded with programming instructions, said storage medium being loaded into a computerized control and evaluation computer of a magnetic resonance apparatus, that also comprises a magnetic resonance data acquisition unit, and said programming instructions causing said computer to:
    receive a computerized processor with a 3D gradient echo sequence that comprises an excitation pulse and a plurality of activated magnetic field gradients, including a readout gradient that, when activated, causes magnetic resonance data to be read out and entered into a memory organized as k-space along k-space lines, said gradient being activated with respective slew rates, amplitudes and polarity changes;
    automatically optimize at least one parameter of said 3D gradient echo sequence selected from the group consisting of said excitation pulse, an order of entry of data into said k-space lines of k-space, and said readout direction, to cause said gradient to be activated with at least one of optimally minimal slew rates, optimally minimal amplitudes, and optimally minimal polarity changes to produce an optimized gradient echo sequence; and operate said data acquisition unit with said optimized gradient echo sequence.

* * * * *